United States Patent
Kamiya

Patent Number: 5,770,995
Date of Patent: Jun. 23, 1998

[54] DETECTOR FOR MASK ALIGNMENT

[75] Inventor: Masayuki Kamiya, Kanagawa, Japan

[73] Assignee: Sony Corporation, Japan

[21] Appl. No.: 674,158

[22] Filed: Jul. 1, 1996

[30] Foreign Application Priority Data

Jul. 12, 1995 [JP] Japan .................................... 7-200506

[51] Int. Cl.⁶ ........................... H01C 10/30; H01L 21/70
[52] U.S. Cl. ........................................... 338/118; 437/924
[58] Field of Search .................................... 338/118, 150; 437/7, 80, 61, 62, 235, 243, 924

[56] References Cited

U.S. PATENT DOCUMENTS

| | | | |
|---|---|---|---|
| 4,125,418 | 11/1978 | Vinton | 437/8 |
| 4,992,394 | 2/1991 | Kostelak, Jr. et al. | 437/229 |
| 5,004,925 | 4/1991 | Takahashi et al. | 250/491.1 |
| 5,335,550 | 8/1994 | Satou | 73/727 |
| 5,369,050 | 11/1994 | Kawai | 437/62 |

*Primary Examiner*—Matthew V. Nguyen
*Attorney, Agent, or Firm*—Ronald P. Kananen

[57] ABSTRACT

A pair of output terminals for measurement of lateral misalignment are formed on an interlayer insulating film, and a series resistance circuit is formed between the pair of output terminals by connecting plural lower layers exposed to plural windows for detection of the lateral misalignment to plural upper layers formed on the interlayer insulating film, so as to measure a synthetic resistance between the pair of output terminals. Similarly, a pair of output terminals for measurement of longitudinal misalignment are formed on the interlayer insulating film, and a series resistance circuit is formed between the pair of output terminals by connecting plural lower layers exposed to plural windows for detection of the longitudinal misalignment to plural upper layers formed on the interlayer insulating film, so as to measure a synthetic resistance between the pair of output terminals. From a change in the synthetic resistance in each series resistance circuit, the misalignment between the interlayer insulating film and the upper layer both in the lateral direction and in the longitudinal direction is measured.

10 Claims, 11 Drawing Sheets

DETECTOR FOR MASK ALIGNMENT

BACKGROUND OF THE INVENTION

The present invention relates to a semiconductor device for alignment detection, which can measure alignment accuracy in patterning such as resist patterning in a process of manufacturing the semiconductor device, with a high accuracy without depending on variations in the manufacturing process.

In a process of manufacturing a semiconductor device, detection of alignment accuracy in resist patterning is an important technique indispensable for improvement in yield of semiconductor devices.

A related art method of measuring the alignment accuracy in resist patterning will be described with reference to FIGS. 1 and 2. As shown in FIGS. 1 and 2, an upper layer 1 as metal wiring is formed on a lower layer 3 as metal wiring through a contact layer 10. An interlayer insulating film 2 of $SiO_2$ formed by resist patterning and etching is formed on the lower layer 3 so as to surround the upper layer 1. The upper layer 1 and the interlayer insulating film 2 are square as viewed in plan, and the lower layer 3 is exposed between the upper layer 1 and the interlayer insulating film 2. With this arrangement, the upper layer 1 and the interlayer insulating film 2 are distinguished as an inside box and an outside box, respectively.

A method of measuring a misalignment between the upper layer 1 and the interlayer insulating film 2 is such that a misalignment between the inside box and the outside box is imaged by a CCD (charge coupled device) in an imaging device, for example, to obtain image data, which is in turn processed to calculate the misalignment.

Since both the upper layer 1 and the interlayer insulating film 2 are square, the misalignment between the upper layer 1 and the interlayer insulating film 2 includes misalignment data both in a lateral direction and in a longitudinal direction. Accordingly, the misalignment data in the lateral direction and the misalignment data in the longitudinal direction are separated from each other to be calculated.

In this method, however, if a box mask for forming the two boxes is rough, for example, the measurement accuracy is remarkably reduced.

FIG. 3 shows a result obtained by using such a rough box mask. In the case where the lower layer 3 is formed of Al deposited by sputtering, the surface of the lower layer 3 is finely roughened by Al particles. The roughness of the surface of the lower layer 3 is transferred to the surface of the interlayer insulating film 2 as a transparent film by a lens effect.

This rough surface of the lower layer 3 is shown in FIG. 3. In the image processing from the upper side of the lower layer 3 by using a CCD, the inside edge of the outside box, that is, the interlayer insulating film 2, becomes rough, causing a remarkable reduction in measurement accuracy of misalignment.

Further, a limit of measurement accuracy is governed by an optical resolution of an optical microscope, the above described method cannot be applied to a microstructure technology in the next or later generation from the viewpoint of accuracy.

FIGS. 4 and 5 illustrate an alignment accuracy detecting method in the related art, in which FIG. 4 is a plan view of a semiconductor wafer 4, and FIG. 5 is an enlarged plan view of an encircled portion Z1 shown in FIG. 4. More specifically, FIG. 4 is an enlarged view of a one-shot region of a plurality of semiconductor circuits 5 formed on the semiconductor wafer 4 shown in FIG. 4 (the one-shot region means a region to be patterned by exposure at one time using an exposure device not shown).

As shown in FIG. 5, the one-shot region includes a plurality of actual circuit pattern portions 6, a plurality of scribing lines 7 for separating the actual circuit pattern portions 6, and a plurality of misalignment evaluation patterns 8 for evaluating misalignment.

As shown in FIG. 5, the misalignment evaluation patterns 8 are located at the center and the four corners of the one-shot region, so as to measure misalignment at the center and the periphery of the one-shot region.

FIG. 6 is an enlarged plan view of each misalignment evaluation pattern 8, and FIG. 7 is a cross section taken along the line A-Al in FIG. 6.

As apparent from FIGS. 6 and 7, the misalignment evaluation pattern 8 includes a lower layer 3 as metal wiring, an interlayer insulating film 2 of $SiO_2$, and an upper layer 9 as metal wiring.

A contact layer 10 is formed at the lower end of the upper layer 9. The contact layer 10 serves to make close contact between the lower layer 3 and the upper layer 9, and is formed by a plurality of metal or alloy layers such as Ti/TiON/Ti layers.

As apparent from FIG. 6, an output terminal 11 of the upper layer 9 and an output terminal 12 of the lower layer 3 are relatively largely formed, because they are brought into contact with input terminals of a tester for measuring a misalignment between the upper layer 9 and the interlayer insulating film 2.

The output terminal 12 of the lower layer 3 is exposed to a window formed through the interlayer insulating film 2.

The interlayer insulating film 2 is further partially opened to form a triangular window 13 to which the lower layer 3 is exposed. The upper layer 9 extends from the output terminal 11 across the triangular window 13, and is kept in contact with the lower layer 3 exposed to the window 13. In any region other than the window 13, the lower layer 3 and the upper layer 9 are separated and electrically insulated from each other by the interlayer insulating film 2.

FIG. 8 is a perspective view showing the contact between the upper layer 9 and the lower layer 3 at the window 13, corresponding to a cross section taken along the line B-Al as a part of the line A-Al shown in FIG. 6.

As shown in FIG. 8, the upper layer 9 is in contact with the lower layer 3 through the contact layer 10 in the window 13. The output layer 10 has a film thickness D and a specific resistance $\rho$.

Accordingly, an electric resistance Rn is generated between the upper layer 9 and the lower layer 3 in the window 13. FIG. 9 shows an equivalent circuit of the configuration shown in FIG. 6.

Referring to FIG. 9, an electric resistance Rn in the form of a variable resistor is connected between the output terminals 12 and 11. The upper layer 9 functions as a slider of the variable resistor Rn, and is slidably movable in the opposite directions of arrows Y1 and Y2 shown in FIG. 6 according to a misalignment n between the upper layer 9 and the interlayer insulating film 2 in such a manner as to be kept in contact with the lower layer 3 exposed to the window 13. Accordingly, the resistance of the variable resistor Rn is varied between the output terminals 11 and 12 by moving the upper layer 9 according to the misalignment n.

The correlation between a change in misalignment and a change in electric resistance Rn will be described. FIG. 10 is an enlarged plan view showing the contact between the upper layer 9 and the lower layer 3 exposed to the window 13 in the case that the misalignment n is equal to 1, and FIG. 11 is a view similar to FIG. 10 in the case that the misalignment n is equal to 2.

As shown in FIGS. 10 and 11, the window 13 is triangular for illustration, and when there occurs misalignment between the upper layer 9 and the interlayer insulating film 2 in the lateral direction as viewed in FIGS. 10 and 11 in patterning the window 13, a contact area between the upper layer 9 and the lower layer 3 exposed to the window 13 is increased or decreased as compared with an ideal condition where the misalignment n is equal to 0.

In the case of FIG. 10, the misalignment n is equal to 1, and the upper layer 9 is shifted rightward from the ideal condition. Assuming that the contact area between the upper layer 9 and the lower layer 3 exposed to the window 13 is denoted by Sn, the case of FIG. 10 shows that the contact area Sn is equal to $S_1$, which is smaller than that in the ideal condition.

In contrast, the case of FIG. 11 shows that the misalignment n is equal to 2, wherein the upper layer 9 is shifted leftward from the ideal condition. In this case, the contact area Sn is equal to $S_2$, which is larger than that in the ideal condition.

Thus, owing to the triangular shape of the window 13, there is a correlation between the misalignment n and the contact area Sn.

There will now be described a relation between the contact area Sn and the electric resistance Rn.

The electric resistance Rn is an electric resistance in the case that the misalignment between the upper layer 9 and the interlayer insulating film 2 is denoted by n. The contact area Sn is a contact area between the contact layer 10 and the lower layer 3 in the case that the misalignment between the upper layer 9 and the interlayer insulating film 2 is denoted by n. The film thickness of the contact layer 10 is denoted by D, and the specific resistance of the contact layer 10 is denoted by $\rho$. In this assumption, the electric resistance Rn is expressed as follows:

$$Rn=(D/Sn)\rho[\Omega \cdot m] \quad (1)$$

Since the film thickness D and the specific resistance $\rho$ of the contact layer 10 are constants with no relation to the misalignment n, Eq. (1) can be replaced by the following equation.

$$Rn=\alpha/Sn[\Omega \cdot m] \quad (2)$$

where $\alpha$ stands for a proportional constant.

As apparent from Eqs. (1) and (2), the contact area Sn and the electric resistance Rn are in inverse proportion to each other.

As apparent from the above description, there is a correlation between the electric resistance Rn and the misalignment n between the upper layer 9 and the interlayer insulating film 2. FIG. 12 is a graph showing this correlation.

In FIG. 12, the horizontal axis represents the misalignment n between the upper layer 9 and the interlayer insulating film 2, and the vertical axis represents the electric resistance Rn. As apparent from FIG. 12, when the misalignment is rightward with respect to the zero misalignment as shown in FIG. 10, the electric resistance Rn increases in proportion to the misalignment, whereas when the misalignment is leftward with respect to the zero misalignment as shown in FIG. 11, the electric resistance Rn decreases in inverse proportion to the misalignment.

This characteristic shown in FIG. 12 is preliminarily grasped in measuring the misalignment between the upper layer 9 and the interlayer insulating film 2.

Measurement of the misalignment between the upper layer 9 and the interlayer insulating film 2 in the lateral direction will be described.

The misalignment in the lateral direction is measured by bringing the input terminals of the tester into contact with the output terminal 12 of the lower layer 3 and the output terminal 11 of the upper layer 9 shown in FIG. 6, and the measuring an electric resistance.

Each of the output terminals 11 and 12 has a size of about tens of microns in each side, so that metal needles as the input terminals of the tester are brought into contact with the output terminals 11 and 12 in measuring the misalignment between the upper layer 9 and the interlayer insulating film 2 in the lateral direction.

Measurement of the misalignment between the upper layer 9 and the interlayer insulating film 2 in the longitudinal direction will be described.

In this case, a circuit similar to that shown in FIG. 6 is prepared with the exception that the triangular window 13 is rotated by 90 degrees on the plane of the semiconductor wafer 4. By using this circuit, the misalignment between the upper layer 9 and the interlayer insulating film 2 in the longitudinal direction is measured as similar to the measurement of the misalignment in the lateral direction mentioned above. That is, as shown in FIGS. 13 and 14, an upper layer 16 as metal wiring similar to the upper layer 9 is kept in sliding contact with the lower layer 3 exposed to a triangular window 15 whose apex angle is pointed in the longitudinal direction, and the misalignment between the upper layer 16 and the interlayer insulating film 2 in the longitudinal direction is similarly measured.

As apparent from FIG. 13, the upper layer 16 is movable in the opposite directions of arrows P1 and P2, and the apex angle of the triangular window 15 is pointed in the longitudinal direction in comparison with the triangular window 13 shown in FIGS. 10 and 11 the apex angle of which is pointed in the lateral direction.

FIG. 14 is a plan view of a misalignment evaluation pattern including both the laterally pointed window 13 and the longitudinally pointed window 15. In FIG. 14, the same parts as those in FIGS. 1 to 13 are denoted by the same reference numerals.

Reference numeral 14 in FIG. 14 denotes an output terminal of the upper layer 15 for measurement of the misalignment between the upper layer 16 and the interlayer insulating film 2 in the longitudinal direction.

The upper layer 15 is formed in an inverted L-shape, and a horizontal portion thereof is in contact with the lower layer 3 exposed to the triangular window 15.

The measurement of the misalignment between the upper layer 16 and the interlayer insulating film 2 in the longitudinal direction is similar to that in the lateral direction mentioned above, so that the description thereof will be omitted to avoid repetition.

A method of manufacturing the lateral and longitudinal misalignment evaluation patterns as shown in FIGS. 6 and 14 will be described with reference to FIGS. 15A to 15E.

FIGS. 15A to 15E correspond to a cross section taken along the line A-Al shown in FIG. 6. As shown in FIG. 15A, metal such as Al is deposited by sputtering to form the lower layer 3. In this step, no etching is carried out.

As shown in FIG. 15B, dielectric such as $SiO_2$ deposited by CVD to form an interlayer insulating film 2A, which will be formed into the interlayer insulating film 2.

As shown in FIG. 15C, the interlayer insulating film 2A is partially removed by photolithography including patterning and etching to open a rectangular window for exposing the output terminal 12 of the lower layer 3 and the triangular windows 13 and 15 for exposing the lower layer 3.

As shown in FIG. 15D, metal such as Al is deposited by sputtering to form an upper layer 9A, which will be formed into the upper layer 9. Although not specifically shown, a metal or alloy layer to be formed into the contact layer 10 is formed under the upper layer 9A.

As shown in FIG. 15E, the upper layer 9A and the metal or alloy layer are partially removed by photolithography including patterning and etching to form the upper layer 9, the contact layer 10, and the output terminals 11 and 14.

This series of manufacturing steps shown in FIGS. 15A to 15E are performed simultaneously with a manufacturing process for the actual circuit patterns 6 shown in FIG. 5.

Further, the metal for the lower layer 3 shown in FIG. 15A may be replaced by one ion-implanted into a semiconductor wafer. Accordingly, the misalignment evaluation pattern can be created and misalignment evaluation can be made even in an initial stage of a semiconductor circuit manufacturing process.

However, in the evaluation pattern shown in FIG. 14 applicable to an alignment accuracy detecting method, the opening areas of the windows 13 and 15 and the line widths of the upper layers 9 and 16 (the line width L of the upper layer 9 being shown in FIG. 16 as a representative) may be varied in the photolithography because of variations in manufacture. Further, the specific resistance ρ and the film thickness D of the contact layer 10 may also be varied.

Such variations in the line width L, the opening area, the specific resistance ρ, and the film thickness D cause a change in the contact area Sn between the upper layer 9 (or 16) and the lower layer 3 or a change in the proportional constant α. As a result, measurement accuracy of the misalignment between the upper layer 9 and the interlayer insulating film 2 is reduced to cause a reduction in yield of semiconductor devices.

SUMMARY OF THE INVENTION

It is accordingly an object of the present invention to provide a semiconductor device for detection of alignment which can prevent a reduction in measurement accuracy of misalignment between an upper layer and an interlayer insulating film even in the case that the surface condition of a lower layer is rough, or the line width of the upper layer is varied, can effectively reduce adverse effects due to measurement accuracy of a tester and external electric noise causing measurement errors, can eliminate the need for any large measuring equipment to greatly shorten the time required for measurement and reduce the costs for the measuring equipment, and can be applied to a microstructure technology in the next or later generation.

It is another object of the present invention to provide a semiconductor device for detection of alignment which can obtain a stable measurement accuracy of misalignment with no influences of variations in manufacture such as variations in line width, film kind, and film thickness of the upper layer, by using a calibration circuit, to thereby greatly improve the measurement reliability.

According to a first aspect of the present invention, there is provided a semiconductor device for detection of alignment, comprising a lower wiring layer formed at a given position on a scribing line for separating an actual circuit pattern formed on a substrate; an interlayer insulating film formed on said lower wiring layer; a pair of first output terminals formed on said interlayer insulating film and used for measurement of misalignment of a resist pattern in a first direction; a first window formed through said interlayer insulating film, for partially exposing said lower wiring layer at a position between said first output terminals, and used for detection of the misalignment of said resist pattern in said first direction; a first upper wiring layer electrically connected to said first output terminals and said lower wiring layer exposed to said first window to form a first resistance circuit between said first output terminals, so as to measure the misalignment of said resist pattern in said first direction as a change in electric resistance between said first output terminals; a pair of second output terminals formed on said interlayer insulating film and used for measurement of misalignment of said resist pattern in a second direction pointed at a given angle to said first direction; a second window formed through said interlayer insulating film, for partially exposing said lower wiring layer at a position between said second output terminals and used for detection of the misalignment of said resist pattern in said second direction; and a second upper wiring layer electrically connected to said second output terminals and said lower wiring layer exposed to said second window to form a second resistance circuit between said second output terminals, so as to measure the misalignment of said resist pattern in said second direction as a change in electric resistance between said second output terminals.

According to a second aspect of the present invention, there is provided a semiconductor device for detection of alignment, comprising a lower wiring layer formed at a given position on a scribing line for separating an actual circuit pattern formed on a substrate; an interlayer insulating film formed on said lower wiring layer; a common window formed through said interlayer insulating film, for partially exposing said lower wiring layer; a common terminal formed as said lower wiring layer exposed to said common window; a first output terminal formed on said interlayer insulating film and used for measurement of misalignment of a resist pattern in a first direction in cooperation with said common terminal; a first window formed through said interlayer insulating film, for partially exposing said lower wiring layer, and used for detection of the misalignment of said resist pattern in said first direction; a first upper wiring layer electrically connected to said first output terminal and said lower wiring layer exposed to said first window, so as to measure the misalignment of said resist pattern in said first direction as a change in electric resistance between said common terminal and said first output terminal; a second output terminal formed on said interlayer insulating film and used for measurement of misalignment of said resist pattern in a second direction pointed at a given angle to said first direction; a second window formed through said interlayer insulating film, for partially exposing said lower wiring layer and used for detection of the misalignment of said resist pattern in said second direction; a second upper wiring layer electrically connected to said second output terminal and said lower wiring layer exposed to said second window, so as to measure the misalignment of said resist pattern in said second direction as a change in electric resistance between said common terminal and said second output terminal; a third window formed through said interlayer insulating film for partially exposing said lower wiring layer, and used for calibration; a third terminal formed on said interlayer insulating film and used for calibration; and a third upper wiring layer electrically connected to said third terminal and said lower wiring layer exposed to said third window to form a calibration circuit, wherein an electric resistance due to contact between said third upper wiring layer and said lower wiring layer exposed to said third window in said calibration circuit is set equal to an electric resistance due to contact between said first upper wiring layer and said lower wiring layer and an electric resistance due to contact between said second upper wiring layer and said lower wiring layer when both the misalignment of said resist pattern in said first direction and the misalignment of said resist pattern in said second direction are zero.

In the first aspect of the present invention, the first upper wiring layer for detection of the misalignment in the first direction is in electric contact with the lower wiring layer exposed to the first window formed through the interlayer insulating film. Accordingly, the electric resistance due to the contact between the first upper wiring layer and the lower wiring layer is generated between the pair of first output terminals. A tester is connected to the first output terminals to measure the electric resistance. A change in the electric resistance corresponds to the misalignment of the resist pattern in the first direction. Therefore, the misalignment of the resist pattern in the first direction can be measured by measuring the change in the electric resistance.

Similarly, the second upper wiring layer for detection of the misalignment in the second direction is in electric contact with the lower wiring layer exposed to the second window formed through the interlayer insulating film. Accordingly, the electric resistance due to the contact between the second upper wiring layer and the lower wiring layer is generated between the pair of second output terminals. Therefore, the misalignment of the resist pattern in the second direction can be measured by connecting the tester to the second output terminals to measure a change in the electric resistance between the second output terminals.

Accordingly, it is possible to obtain a semiconductor device for detection of alignment which can prevent a reduction in measurement accuracy of misalignment between an upper layer and an interlayer insulating film even in the case that the surface condition of a lower layer is rough, or the line width of the upper layer is varied, can effectively reduce adverse effects due to measurement accuracy of a tester and external electric noise causing measurement errors, can eliminate the need for any large measuring equipment to greatly shorten the time required for measurement and reduce the costs for the measuring equipment, and can be applied to a microstructure technology in the next or later generation.

In the second aspect of the present invention, the first upper wiring layer for detection of the misalignment in the first direction is in electric contact with the lower wiring layer exposed to the first window formed through the interlayer insulating film to thereby generate the electric resistance, which is then measured by connecting a tester to the common terminal and the first output terminal. Since a change in the electric resistance corresponds to the misalignment in the first direction, the misalignment in the first direction can be measured by measuring this change.

Similarly, the second upper wiring layer for detection of the misalignment in the second direction is in electric contact with the lower wiring layer exposed to the second window formed through the interlayer insulating film. The electric resistance due to this electric contact is measured by connecting the tester to the common terminal and the second output terminal. Then, the misalignment in the second direction is measured by measuring a change in this electric resistance.

Furthermore, the size of the third window for calibration is set so that the contact area between the third upper wiring layer and the lower wiring layer in the calibration circuit is equal to the contact area between the first upper wiring layer and the lower wiring layer and the contact area between the second upper wiring layer and the lower wiring layer when both the misalignment in the first direction and the misalignment in the second direction are zero. The electric resistance corresponding to this contact area in the calibration circuit is used as an index. The misalignment in the first direction is measured by obtaining a difference between the index and the electric resistance due to the contact between the first upper wiring layer and the lower wiring layer. Similarly, the misalignment in the second direction is measured by obtaining a difference between the index and the electric resistance due to the contact between the second upper wiring layer and the lower wiring layer.

Accordingly, it is possible to obtain a semiconductor device for detection of alignment which can obtain a stable measurement accuracy of misalignment with no influences of variations in manufacture such as variations in line width, film kind, and film thickness of the upper layer, by using a calibration circuit, to thereby greatly improve the measurement reliability.

DETAILED DESCRIPTION OF THE PREFERRED EMBODIMENTS

Some preferred embodiments of the present invention will now be described in detail with reference to the drawings.

Figure 17:
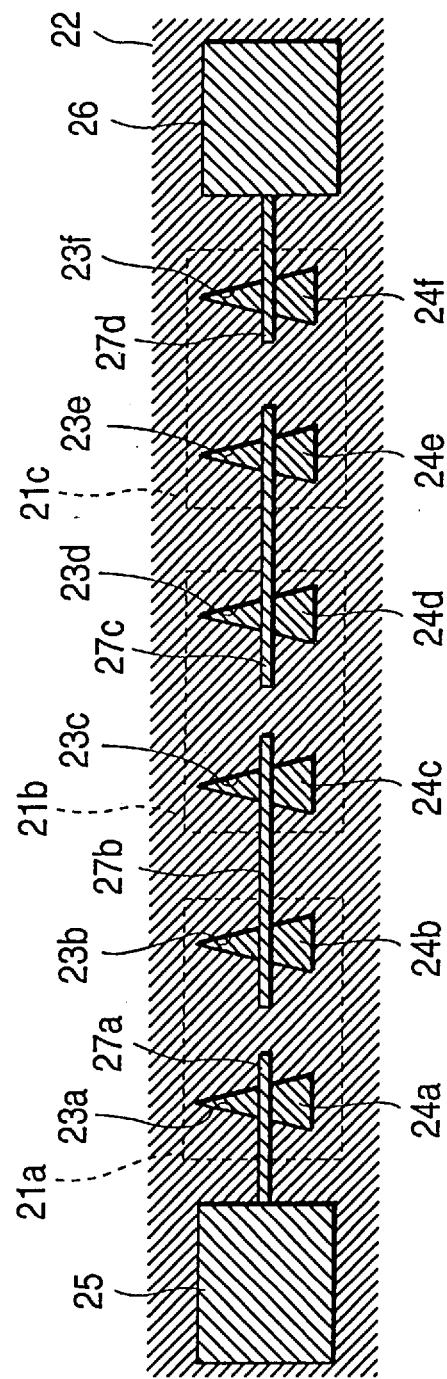
FIG. 17 is a plan view of an evaluation circuit pattern according to a first preferred embodiment of the present invention.

FIG. 17 is a plan view showing the configuration of a first preferred embodiment of the present invention. While this preferred embodiment is applied to measurement of the misalignment between an upper layer and an interlayer insulating film both in a longitudinal direction and in a lateral direction, the measurement of the misalignment only in the longitudinal direction will be described for simplicity of illustration.

Figure 18:
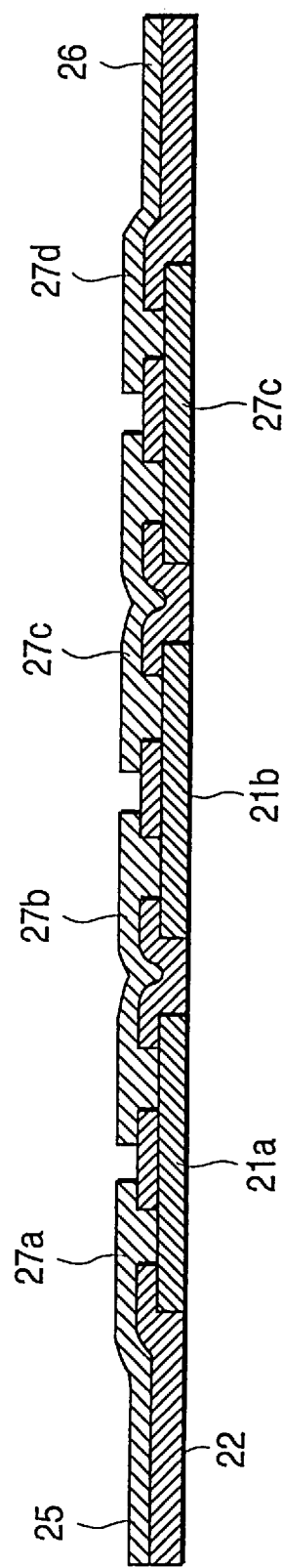
FIG. 18 is a lateral sectional view of a central portion of FIG. 17.
Figure 19:
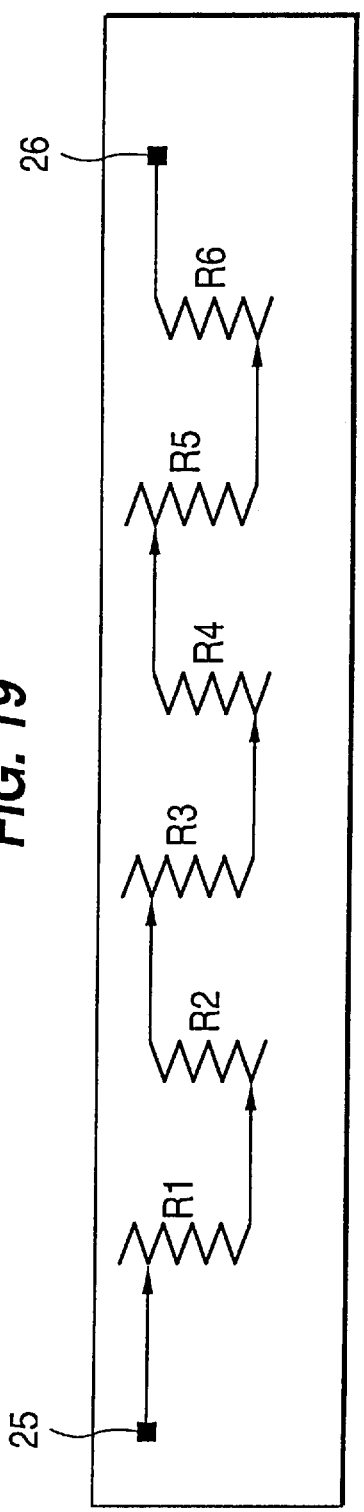
FIG. 19 is an equivalent electric circuit diagram of the evaluation circuit pattern shown in FIG. 17.

FIG. 18 is a lateral sectional view of a central portion of FIG. 17, and a contact layer is not shown in FIG. 18 for simplicity of illustration. FIG. 19 is an equivalent circuit diagram of the configuration shown in FIG. 17.

Figure 1:
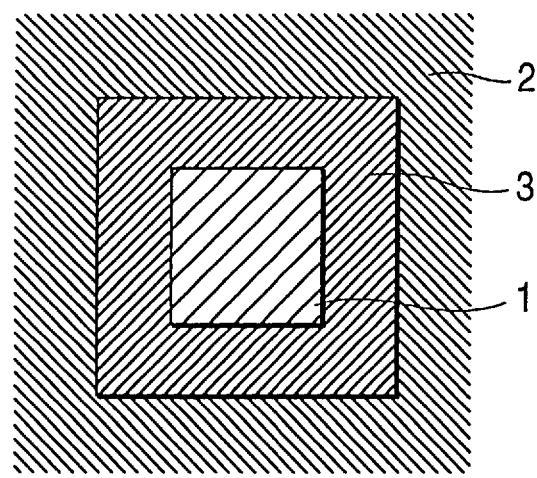
FIG. 1 is a plan view for illustrating alignment of a resist pattern in a manufacturing process for a semiconductor device in the related art.
Figure 2:
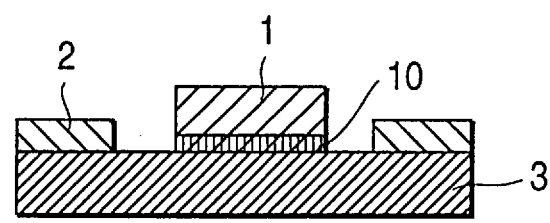
FIG. 2 is a sectional view of FIG. 1.
Figure 3:
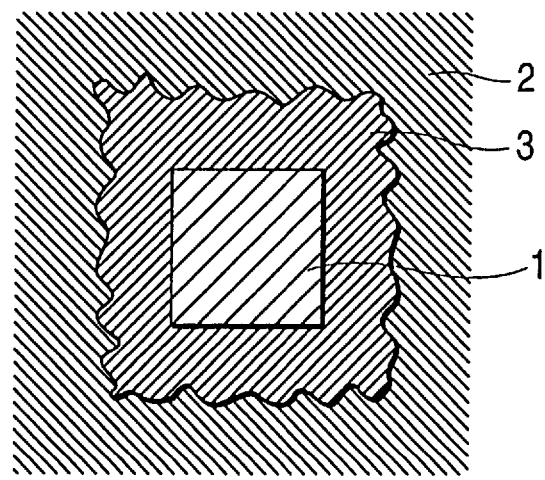
FIG. 3 is a plan view for illustrating a reduction in measurement accuracy of alignment due to roughness of the edge of an interlayer insulating film in aligning a resist pattern in the related art.
Figure 4:
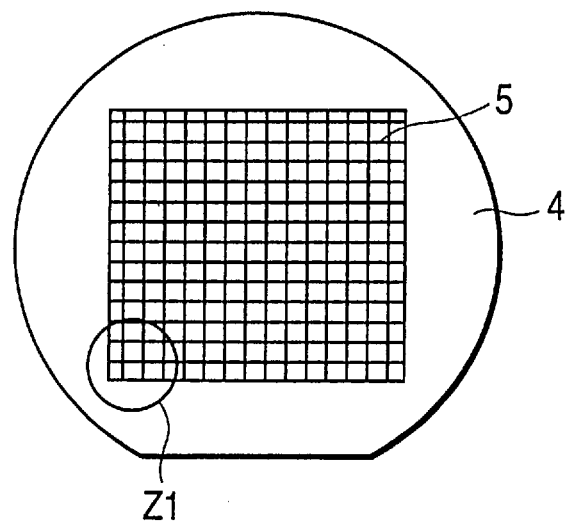
FIG. 4 is a plan view of a semiconductor wafer used in a manufacturing process for a semiconductor device.
Figure 5:
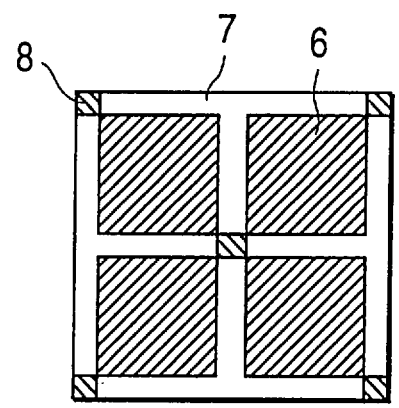
FIG. 5 is an enlarged plan view of an encircled portion Z1 shown in FIG. 4.
Figure 6:
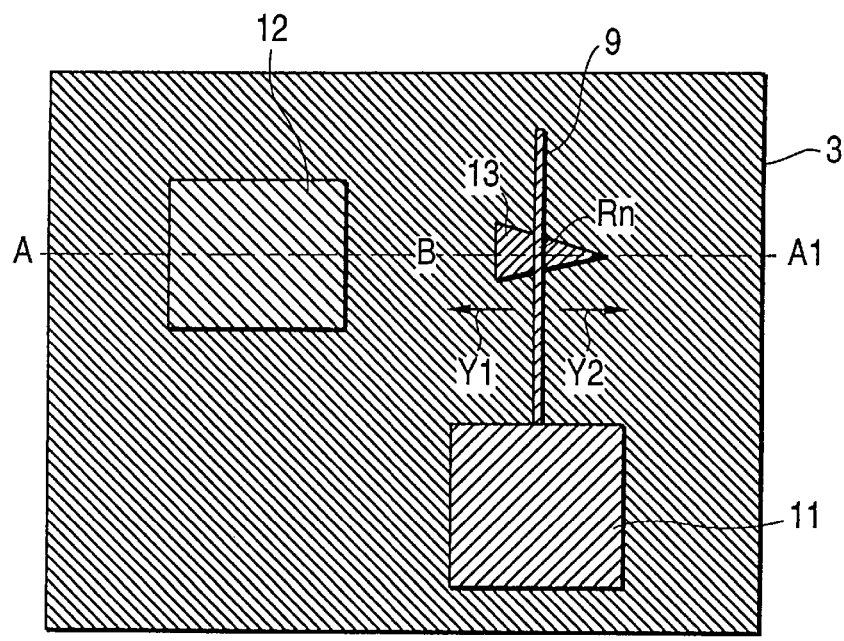
FIG. 6 is an enlarged plan view of an evaluation circuit pattern shown in FIG. 5.
Figure 7:
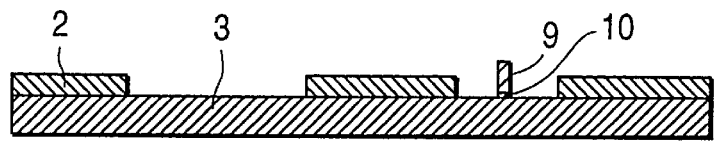
FIG. 7 is a cross section taken along the line A-A1 in FIG. 6.
Figure 8:
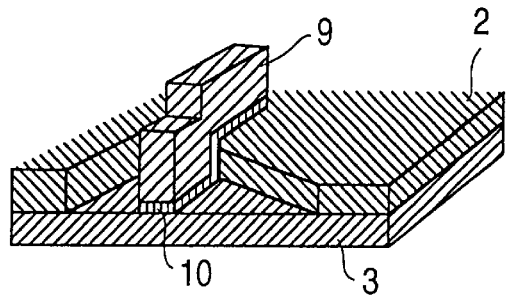
FIG. 8 is a perspective view of a contact portion between an upper layer and a lower layer shown in FIGS. 6 and 7.
Figure 9:
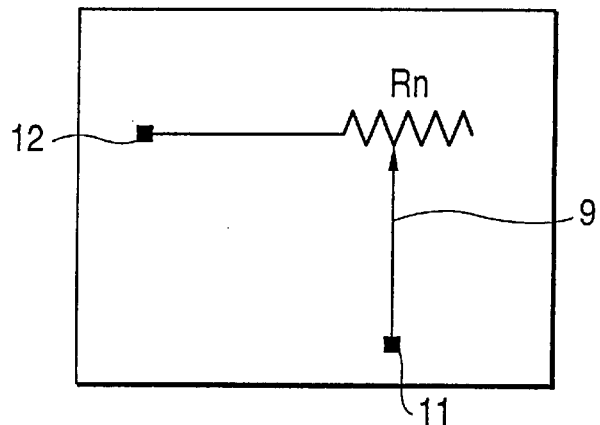
FIG. 9 is an equivalent electric circuit diagram of the evaluation circuit pattern shown in FIG. 6.
Figure 10:
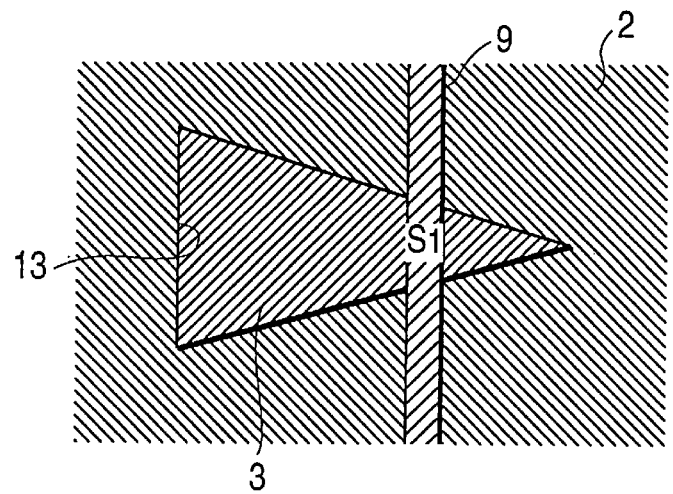
FIG. 10 is an enlarged plan view of the contact portion in the evaluation circuit pattern shown in FIG. 6 in the case that the misalignment n in the lateral direction is equal to 1.
Figure 11:
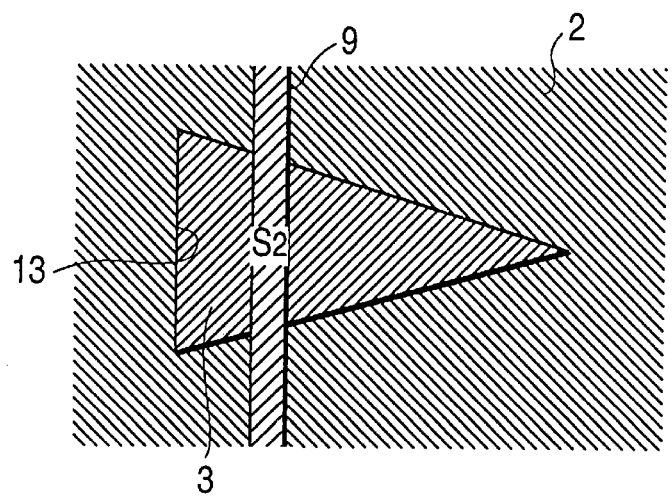
FIG. 11 is a view similar to FIG. 10, showing the case that the misalignment n in the lateral direction is equal to 2.
Figure 12:
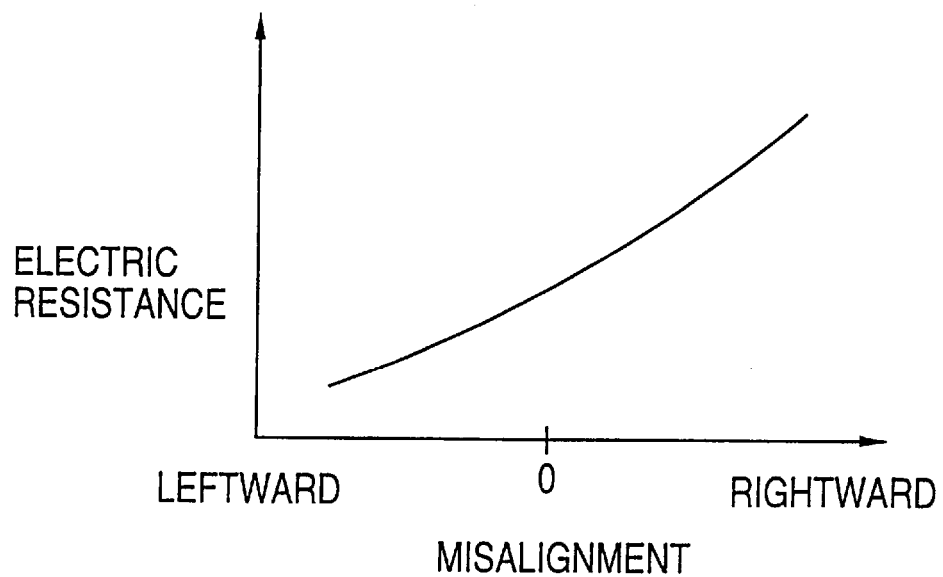
FIG. 12 is a characteristic graph showing the correlation between misalignment and electric resistance.
Figure 13:
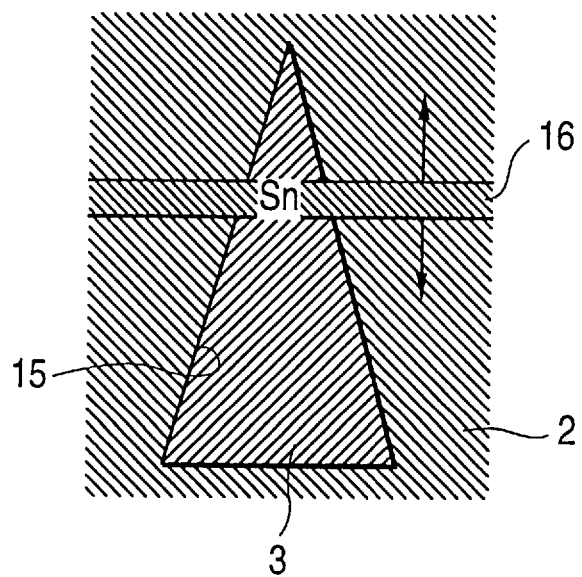
FIG. 13 is an enlarged plan view of a contact portion between the lower layer and the upper layer for detection of the longitudinal misalignment in an evaluation circuit pattern in the related art.
Figure 14:
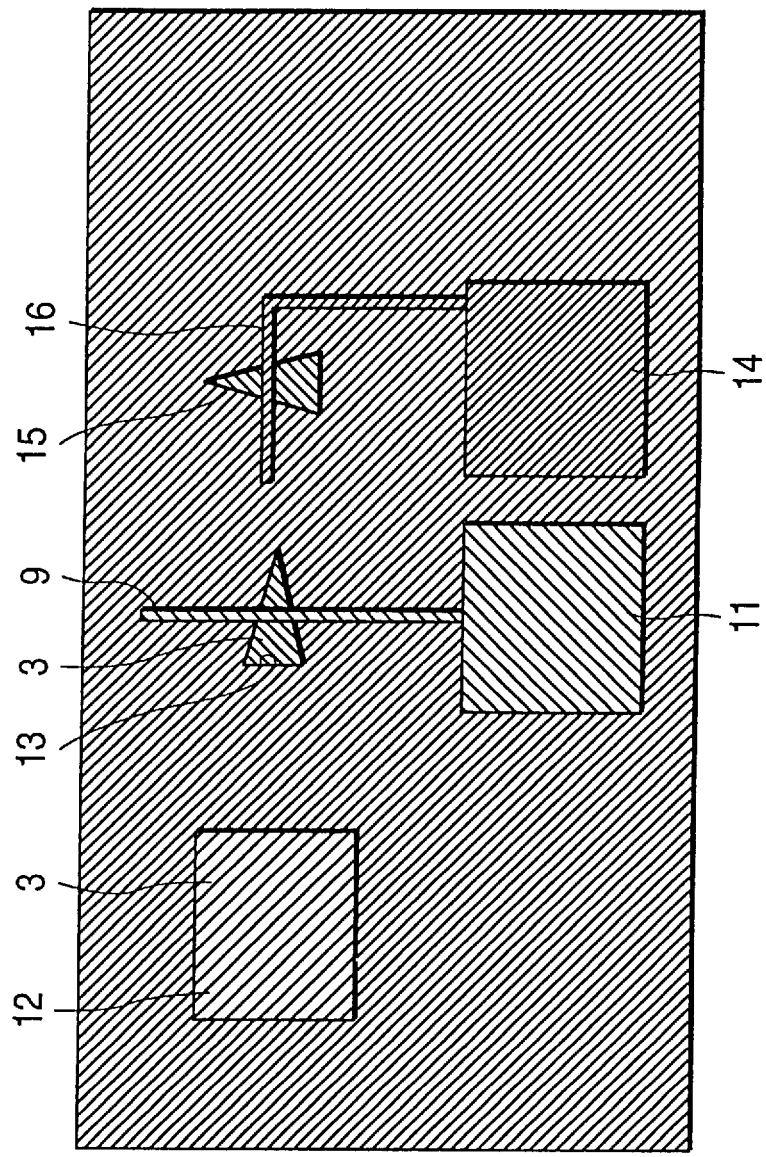
FIG. 14 is a plan view of an evaluation circuit pattern including contact portions for detection of both the lateral misalignment and the longitudinal misalignment in the related art.
Figure 15A:
FIGS. 15A to 15E are sectional views showing a manufacturing process for an evaluation circuit pattern in the related art.
Figure 15B:
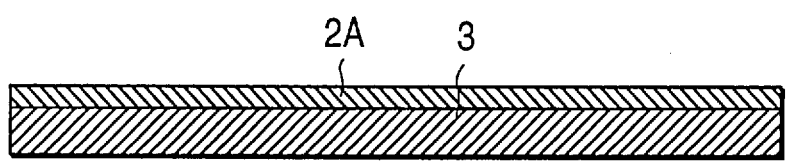
Figure 15C:
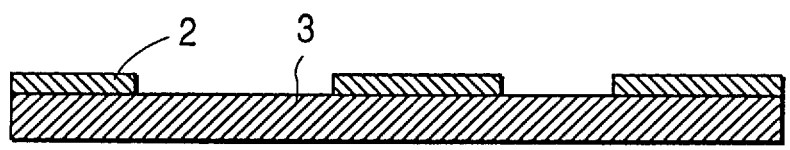
Figure 15D:
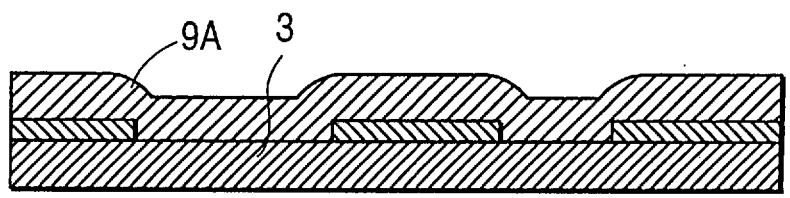
Figure 15E:
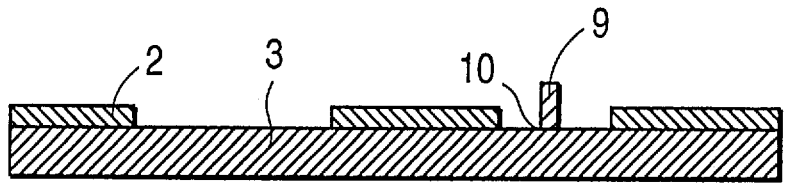

The first preferred embodiment shown in FIGS. 17 to 19 is configured so that a plurality of contact resistors are connected in series. More specifically, six contact resistors each having a configuration as shown in FIG. 14 are connected in series. As shown in FIG. 18, three separated lower layers 21a, 21b, and 21c as metal wiring are formed by depositing metal such as Al on a semiconductor wafer (not shown) by sputtering, and then patterning the metal film.

An interlayer insulating film 22 is formed on the lower layers 21a, 21b, and 21c by depositing an oxide film such as an $SiO_2$ film by CVD, and then patterning and etching the oxide film by photolithography to open triangular windows 23a, 23b, 23c, 23d, 23e, and 23f for detection of the longitudinal misalignment between the interlayer insulating film 22 and upper layers 27a, 27b, 27c, and 27d. The lower layer 21a is exposed to the windows 23a and 23b; the lower layer 21b is exposed to the windows 23c and 23d; and the lower layer 21c is exposed to the windows 23e and 23f.

In FIG. 17, reference numerals 24a, 24b, 24c, 24d, 24e, and 24f denote exposed portions of the lower layers 21a to 21c exposed to the windows 23a, 23b, 23c, 23d, 23e, and 23f, respectively.

Accordingly, the exposed portions 24a and 24b of the lower layer 21a are electrically connected together below the interlayer insulating film 22; the exposed portions 24c and 24d of the lower layer 21b are electrically connected together below the interlayer insulating film 22; and the exposed portions 24e and 24f of the lower layer 21c are electrically connected together below the interlayer insulating film 22. However, all the exposed portions 24a to 24f are electrically insulated from each other above the interlayer insulating film 22.

A pair of output terminals 25 and 26 for measurement of the longitudinal misalignment and four upper layers 27a, 27b, 27c, and 27d as metal wiring for detection of the longitudinal misalignment are simultaneously formed by depositing metal over the surface of the wafer by sputtering so as to cover the exposed portions 24a to 24f, and then patterning and etching the metal film by photolithography using photoresist.

The output terminals 25 and 26 are formed in a square shape and they are located in the vicinity of the lateral ends of the interlayer insulating film 22. Although not shown, input terminals of a tester for measuring the longitudinal misalignment between the interlayer insulating film 22 and the upper layers 27a to 27d are brought into contact with the output terminals 25 and 26.

The upper layer 27a extends from the output terminal 25 across the window 23a and is in electric contact with the exposed portion 24a of the lower layer 21a.

The upper layer 27b extends across the windows 23b and 23c and is in electrical contact with the exposed portion 24b of the lower layer 21a and the exposed portion 24c of the lower layer 21b.

The upper layer 27c extends across the windows 23d and 23e and is in electric contact with the exposed portion 24d of the lower layer 21b and the exposed portion 24e of the lower layer 21c.

The upper layer 27d extends from the output terminal 26 across the window 23f and is in electric contact with the exposed portion 24f of the lower layer 21c.

With this configuration, a resistance R1 is generated by the contact between the upper layer 27a and the exposed portion 24a of the lower layer 21a; a resistance R2 is generated by the contact between the upper layer 27b and the exposed portion 24b of the lower layer 21a; a resistance R3 is generated by the contact between the upper layer 27b and the exposed portion 24c of the lower layer 21b; a resistance R4 is generated by the contact between the upper layer 27c and the exposed portion 24d of the lower layer 21b; a resistance R5 is generated by the contact between the upper layer 27c and the exposed portion 24e of the lower layer 21c; and a resistance R6 is generated by the contact between the upper layer 27d and the exposed portion 24f of the lower layer 21c.

As shown in FIG. 19, these resistances R1 to R6 form a six-stage series resistance circuit between the output terminals 25 and 26.

The input terminals of the tester are electrically connected to the opposite ends of the series resistance circuit, that is, to the output terminals 25 and 26, thereby allowing measurement of a synthetic resistance value in the series resistance circuit. From the result of measurement of the synthetic resistance value, the longitudinal misalignment between the interlayer insulating film 22 and the upper layers 27a to 27d can be detected.

The number of stages in the series resistance circuit between the output terminals 25 and 26 may be freely set. Letting w denote the number of stages, n denote the misalignment to be measured between the output terminals 25 and 26, and Rn denote the synthetic resistance value corresponding to the misalignment n, the synthetic resistance value Rn is expressed as follows:

$$Rn = R_o \cdot w + \Delta Rn \cdot w \qquad (3)$$

where $R_o$ stands for a resistance value of each contact resistor in the case where the misalignment n is zero, and $\Delta Rn$ stands for a change in resistance value of each contact resistor due to the occurrence of the misalignment n.

As apparent from Eq. (3), the change $\Delta Rn$ in resistance of each contact resistor due to the occurrence of the misalignment n is multiplied by the number of stages, w in the series resistance circuit having a plurality of contact resistors (whose number is w), in detecting the synthetic resistance value Rn.

In other words, the detection accuracy more sensitive to the misalignment can be obtained.

Although there has been described the measurement of only the longitudinal misalignment for simplicity, the measurement of the lateral misalignment can be similarly made.

According to the first preferred embodiment, the misalignment can be measured by measuring the synthetic resistance value in the series resistance circuit having a plurality of stages of contact resistors rather than by a related art misalignment measuring method using image processing. Accordingly, manufacturing errors of the individual contact resistors can be averaged so as to be canceled, and fine resistance values can be amplified, thereby avoiding a reduction in accuracy of misalignment measurement. Further, adverse effects due to measurement accuracy of the tester and external electric noise can be effectively reduced to greatly improve the reliability of measurement.

Further, since primary equipment required for the measurement is only the tester for measuring an electric resistance, any large measuring device as in the related art is not required, but a simple measuring device is merely necessary. In addition, the time required for measurement of an electric resistance is short. Accordingly, the production cost and the running cost of the measuring equipment can be greatly reduced.

Further, the measurement accuracy of the electric resistance can be freely adjusted, so that the measurement accuracy of the misalignment can be easily improved to allow application of the misalignment evaluating method to a microstructure technology in the next or later generation.

Figure 16:
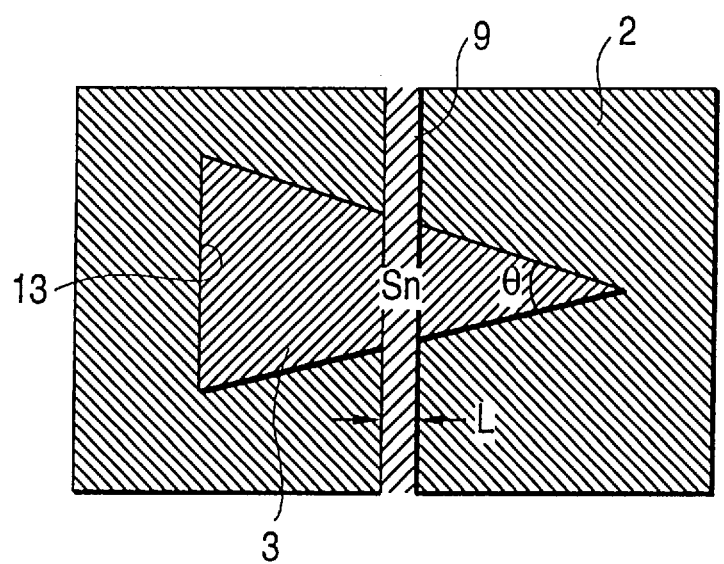
FIG. 16 is an enlarged plan view for illustrating variations in line width of the upper layer in the related art.

A second preferred embodiment of the present invention will now be described. In this preferred embodiment, the apex angle θ (see FIG. 16) of each of the triangular windows 23a to 23f shown in FIG. 17 for detection of the longitudinal misalignment (also of triangular windows for detection of the lateral misalignment) is enlarged.

By enlarging the apex angle θ of each triangular window, a change rate of the contact area between each of the upper layers 27a to 27d and each of the exposed portions 24a to 24f of the lower layers 21a to 21c per unit amount of misalignment can be enlarged. Accordingly, a change in electric resistance of the contact resistor between each of the upper layers 27a to 27d and each of the exposed portions 24a to 24f can be detected with higher sensitivity.

If the apex angle θ is excessive, the size of the evaluation pattern would also be excessive as a whole to cause interference in arrangement. Accordingly, the maximum value of the apex angle θ is set to less than 180 degrees.

A reduction in accuracy of the misalignment measurement is caused not only by variations in line width of each upper layer for detection of the longitudinal misalignment and the lateral misalignment, but also by variations in manufacture.

Such variations in manufacture include variations in size of the windows 23a to 23f in processing the interlayer insulating film 22, and variations in specific resistance ρ and film thickness D of the contact layer due to a change in film kind.

These variations cause a change in the proportional constant α in Eq. (2), thus inviting a reduction in measurement accuracy.

A third preferred embodiment of the present invention intended to collectively eliminate these variations will now be described.

In this preferred embodiment, a calibration circuit is added to compare an electric resistance in the calibration circuit and an electric resistance between output terminals for measurement of the longitudinal misalignment (also an electric resistance between output terminals for measurement of the lateral misalignment) and correct the misalignment between an interlayer insulating film and an upper layer for detection of the longitudinal misalignment (also an upper layer for detection of the lateral misalignment).

Figure 20:
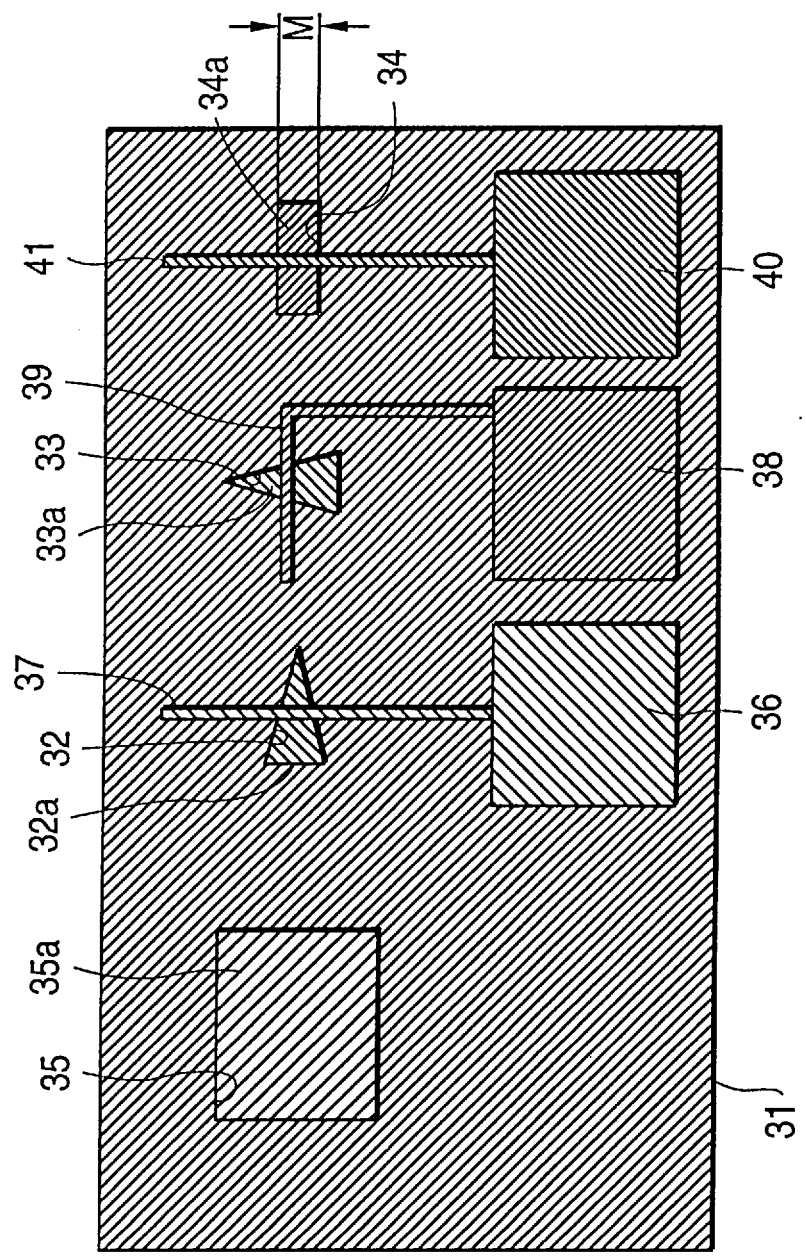
FIG. 20 is a plan view of an evaluation circuit pattern according to a third preferred embodiment of the present invention.

FIG. 20 is a plan view of a misalignment evaluation pattern additionally including such a calibration circuit.

As shown in FIG. 20, a laterally pointed triangular window 32 for detection of lateral misalignment, a longitudinally pointed triangular window 33 for detection of longitudinal misalignment, and a rectangular calibration window 34 are opened through an interlayer insulating film 31 by etching. These windows 32, 33, and 34 are located on the same line. Further, a rectangular window 35 is also opened through the interlayer insulating film 31 on the left side of the window 32 as viewed in FIG. 20, so as to expose a common terminal.

Lower layers 32a, 33a, 34a, and 35a as metal wiring formed below the interlayer insulating film 31 are exposed to the windows 32, 33, 34, and 35, respectively. The lower layer 35a serves as the common terminal in measurement of misalignment.

The lower layers 32a, 33a, 34a, and 35a are electrically connected together below the interlayer insulating film 31.

An output terminal 36 for measurement of lateral misalignment is formed on the interlayer insulating film 31 in parallel to the window 32 by depositing metal such as Al and then performing photolithography including patterning and etching. An upper layer 37 as metal wiring extends from the output terminal 36 across the window 32 and is in electric contact with the lower layer 32a exposed to the window 32. The upper layer 37 is formed simultaneously with the output terminal 36.

Measurement of lateral misalignment, that is, measurement of electric resistance, is made by connecting the common terminal 35a and the output terminal 36 to a tester.

Similarly, an output terminal 38 and an upper layer 39 as metal wiring for detection of longitudinal misalignment are simultaneously formed on the interlayer insulating film 31 by metal deposition and photolithography. The upper layer 39 extends from the output terminal 38 across the window 33 and is in electric contact with the lower layer 33a exposed to the window 33.

Measurement of longitudinal misalignment, that is, measurement of electric resistance, is made by connecting the common terminal 35a and the output terminal 38 to the tester.

Further, a calibration terminal 40 and an upper layer 41 as metal wiring for calibration are simultaneously formed on the interlayer insulating film 31 by metal deposition and photolithography. The upper layer 41 extends from the calibration terminal 40 across the window 34 and is in electric contact with the lower layer 34a exposed to the window 34.

The lower layer 34a, the calibration terminal 40, and the upper layer 41 constitute a calibration circuit.

Measurement of electric resistance in the calibration circuit is made by connecting the common terminal 35a and the calibration terminal 40 to the tester.

The operation of the third preferred embodiment will be described. The electric resistance between the upper layer 37 and the lower layer 32a can be measured by connecting the common terminal 35a and the output terminal 36 to the tester. An ideal condition is obtained in the case that the lateral misalignment between the interlayer insulating film 31 and the upper layer 37 is zero.

Similarly, the electric resistance between the upper layer 39 and the lower layer 33a can be measured by connecting the common terminal 35a and the output terminal 38 to the tester. In the ideal condition, the longitudinal misalignment between the interlayer insulating film 31 and the upper layer 39 is also zero.

Letting S3 denote the contact area between the upper layer 37 and the lower layer 32a and the contact area between the upper layer 39 and the lower layer 33a in the ideal condition, the length M of the vertical side of the rectangular calibration window 34 (i.e., the lower layer 34a exposed to the rectangular calibration window 34) is set so that the contact area between the upper layer 41 and the lower layer 34a becomes equal to the contact area S3.

That is, the contact area between the upper layer 41 and the lower layer 34a is fixed regardless of misalignment between the upper layer 37 and the lower layer 32a and misalignment between the upper layer 39 and the lower layer 33a.

Accordingly, the electric resistance due to the contact between the upper layer 41 and the lower layer 34a becomes an index when both the longitudinal misalignment and the lateral misalignment are zero.

More specifically, by using a difference between the electric resistance obtained in the calibration circuit and the electric resistance due to the contact between the upper layer 37 and the lower layer 32a, and by using a difference between the electric resistance obtained in the calibration circuit and the electric resistance due to the contact between the upper layer 39 and the lower layer 33a, the lateral misalignment between the interlayer insulating film 31 and the upper layer 37 and the longitudinal misalignment between the interlayer insulating film 31 and the upper layer 39 are detected.

Based on the lateral misalignment and the longitudinal misalignment thus detected, correction control of the lateral misalignment and the longitudinal misalignment of a resist pattern can be performed.

Even when there occur changes in electric resistance corresponding to the misalignment between the upper layer 37 and the lower layer 32a and electric resistance corresponding to the misalignment between the upper layer 39 and the lower layer 33a, the electric resistance in the calibration circuit changes in the same amount. Accordingly, the changes in electric resistance can be canceled in the result of calculation using the differences in electric resistance mentioned above. Thus, the final measurement result of misalignment is not influenced by the changes.

According to the third preferred embodiment as described above, the measurement accuracy of misalignment can be stably obtained with no influence of variations in manufacture such as variations in line width, film kind, and film thickness of the upper layer 37, the upper layer 39, etc. As a result, the measurement reliability can be greatly improved.

As similar to the second preferred embodiment, the apex angles of the triangular windows 32 and 33 may be enlarged to thereby enlarge the rate of change in contact area between the lower layer 32a and the upper layer 37 per unit amount of lateral misalignment and the rate of change in contact area between the lower layer 33a and the upper layer 39 per unit amount of longitudinal misalignment. In this case, a change in electric resistance at each contact portion can be detected with higher sensitivity.

As described above, according to the first aspect of the present invention, a pair of output terminals for measurement of lateral misalignment are formed on an interlayer insulating film, and a series resistance circuit is formed between the pair of output terminals by connecting plural lower layers exposed to plural windows for detection of the lateral misalignment to plural upper layers formed on the interlayer insulating film, so as to measure a synthetic resistance between the pair of output terminals. Similarly, a pair of output terminals for measurement of longitudinal misalignment are formed on the interlayer insulating film, and a series resistance circuit is formed between the pair of output terminals by connecting plural lower layers exposed to plural windows for detection of the longitudinal misalignment to plural upper layers formed on the interlayer insulating film, so as to measure a synthetic resistance between the pair of output terminals. From a change in the synthetic resistance in each series resistance circuit, the misalignment between the interlayer insulating film and the upper layer both in the lateral direction and in the longitudinal direction is measured. Accordingly, it is possible to provide a semiconductor device for detection of alignment which can prevent a reduction in measurement accuracy of misalignment between an upper layer and an interlayer insulating film even in the case that the surface condition of a lower layer is rough, or the line width of the upper layer is varied, can effectively reduce adverse effects due to measurement accuracy of a tester and external electric noise causing measurement errors, can eliminate the need for any large measuring equipment to greatly shorten the time required for measurement and reduce the costs for the measuring equipment, and can be applied to a microstructure technology in the next or later generation.

According to the second aspect of the present invention, a rectangular calibration window is formed through an interlayer insulating film, and a lower layer for calibration is exposed to the calibration window. An upper layer for calibration is in contact with the lower layer for calibration. The contact area between the upper layer and the lower layer for calibration is equal to the contact area between an upper layer for detection of lateral misalignment and a lower layer exposed to a window for detection of the lateral misalignment in an ideal condition where the lateral misalignment is zero, and is also equal to the contact area between an upper layer for detection of longitudinal misalignment and a lower layer exposed to a window for detection of the longitudinal misalignment in the ideal condition where the longitudinal misalignment is zero. The electric resistance due to the contact between the upper layer and the lower layer for calibration is set as an index. From a difference between this index and the electric resistance due to the contact between the upper layer and the lower layer for detection of the lateral misalignment and a difference between this index and the electric resistance due to the contact between the upper layer and the lower layer for detection of the longitudinal misalignment, measurement of the lateral misalignment and the longitudinal misalignment is made. Accordingly, it is possible to provide a semiconductor device for detection of alignment which can obtain a stable measurement accuracy of misalignment with no influences of variations in manufacture such as variations in line width, film kind, and film thickness of the upper layer, by using a calibration circuit, to thereby greatly improve the measurement reliability.

What is claimed is:

1. A semiconductor device for detection of alignment, comprising:
   a lower wiring layer formed at a given position on a scribing line for separating an actual circuit pattern formed on a substrate;
   an interlayer insulating film formed on said lower wiring layer;

a pair of first output terminals formed on said interlayer insulating film and used for measurement of misalignment of a resist pattern in a first direction;

a first window formed through said interlayer insulating film, for partially exposing said lower wiring layer at a position between said first output terminals, and used for detection of the misalignment of said resist pattern in said first direction;

a first upper wiring layer electrically connected to said first output terminals and said lower wiring layer exposed to said first window to form a first resistance circuit between said first output terminals, so as to measure the misalignment of said resist pattern in said first direction as a change in electric resistance between said first output terminals;

a pair of second output terminals formed on said interlayer insulating film and used for measurement of misalignment of said resist pattern in a second direction pointed at a given angle to said first direction;

a second window formed through said interlayer insulating film, for partially exposing said lower wiring layer at a position between said second output terminals and used for detection of the misalignment of said resist pattern in said second direction; and a second upper wiring layer electrically connected to said second output terminals and said lower wiring layer exposed to said second window to form a second resistance circuit between said second output terminals, so as to measure the misalignment of said resist pattern in said second direction as a change in electric resistance between said second output terminals.

2. A semiconductor device according to claim 1, wherein said change in electric resistance between said first output terminals is replaced by a change in specific resistance of a contact surface between said first upper wiring layer and said lower wiring layer exposed to said first window, and said change in electric resistance between said second output terminals is replaced by a specific resistance of a contact surface between said second upper wiring layer and said lower wiring layer exposed to said second window.

3. A semiconductor device according to claim 1, wherein said first window has a triangular shape whose apex angle is pointed in said first direction, and said second window has a triangular shape whose apex angle is pointed in said second direction, said apex angle of each of said first and second windows being set to a given angle.

4. A semiconductor device according to claim 3, wherein said given angle is a maximum angle allowed as an apex angle of a triangle.

5. A semiconductor device for detection of alignment, comprising:

a lower wiring layer formed at a given position on a scribing line for separating an actual circuit pattern formed on a substrate;

an interlayer insulating film formed on said lower wiring layer;

a common window formed through said interlayer insulating film, for partially exposing said lower wiring layer;

a common terminal formed as said lower wiring layer exposed to said common window;

a first output terminal formed on said interlayer insulating film and used for measurement of misalignment of a resist pattern in a first direction in cooperation with said common terminal;

a first window formed through said interlayer insulating film, for partially exposing said lower wiring layer, and used for detection of the misalignment of said resist pattern in said first direction;

a first upper wiring layer electrically connected to said first output terminal and said lower wiring layer exposed to said first window, so as to measure the misalignment of said resist pattern in said first direction as a change in electric resistance between said common terminal and said first output terminal;

a second output terminal formed on said interlayer insulating film and used for measurement of misalignment of said resist pattern in a second direction pointed at a given angle to said first direction;

a second window formed through said interlayer insulating film, for partially exposing said lower wiring layer and used for detection of the misalignment of said resist pattern in said second direction;

a second upper wiring layer electrically connected to said second output terminal and said lower wiring layer exposed to said second window, so as to measure the misalignment of said resist pattern in said second direction as a change in electric resistance between said common terminal and said second output terminal;

a third window formed through said interlayer insulating film for partially exposing said lower wiring layer, and used for calibration;

a third terminal formed on said interlayer insulating film and used for calibration; and a third upper wiring layer electrically connected to said third terminal and said lower wiring layer exposed to said third window to form a calibration circuit, wherein an electric resistance due to contact between said third upper wiring layer and said lower wiring layer exposed to said third window in said calibration circuit is set equal to an electric resistance due to contact between said first upper wiring layer and said lower wiring layer and an electric resistance due to contact between said second upper wiring layer and said lower wiring layer when both the misalignment of said resist pattern in said first direction and the misalignment of said resist pattern in said second direction are zero.

6. A semiconductor device according to claim 5, wherein said first window has a triangular shape whose apex angle is pointed in said first direction, and said second window has a triangular shape whose apex angle is pointed in said second direction, said apex angle of each of said first and second windows being set to a given angle.

7. A semiconductor device according to claim 5, wherein said given angle is a maximum angle allowed as an apex angle of a triangle.

8. A semiconductor device according to claim 5, wherein a difference between the electric resistance due to the contact between said third upper wiring layer and said lower wiring layer in said calibration circuit and the electric resistance due to the contact between at least one of said first and second upper wiring layers and said lower wiring layer is used for correction control of the misalignment of said resist pattern in at least one of said first and second directions.

9. A semiconductor device according to claim 5, wherein said given angle between said first direction and said second direction is a substantially right angle.

10. A semiconductor device according to claim 5, wherein said first, second, and third upper wiring layers and/or said lower wiring layer are formed of metal.

* * * * *